US012716949B2

(12) United States Patent
Kong et al.

(10) Patent No.: US 12,716,949 B2
(45) Date of Patent: Aug. 25, 2026

(54) BATTERY CONDITION MONITORING DEVICE AND METHOD, AND BATTERY PROTECTION DEVICE

(71) Applicant: LG ENERGY SOLUTION, LTD., Seoul (KR)

(72) Inventors: Sung Shik Kong, Daejeon (KR); Minkyu Kim, Daejeon (KR); Byeongho Mun, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 288 days.

(21) Appl. No.: 18/287,273

(22) PCT Filed: Oct. 11, 2022

(86) PCT No.: PCT/KR2022/015268
§ 371 (c)(1),
(2) Date: Oct. 17, 2023

(87) PCT Pub. No.: WO2023/106592
PCT Pub. Date: Jun. 15, 2023

(65) Prior Publication Data

US 2024/0201268 A1 Jun. 20, 2024

(30) Foreign Application Priority Data

Dec. 6, 2021 (KR) ........................ 10-2021-0173099

(51) Int. Cl.
*G01R 31/382* (2019.01)
*H02H 7/18* (2006.01)

(52) U.S. Cl.
CPC ............. *G01R 31/382* (2019.01); *H02H 7/18* (2013.01)

(58) Field of Classification Search
CPC .............. G01R 31/382; G01R 19/0092; G01R 31/2827; G01R 31/2829; G01R 35/00;
(Continued)

(56) References Cited

U.S. PATENT DOCUMENTS 8,463,562 B2 * 6/2013 Nakanishi ............... B60L 58/21 320/120
9,018,866 B2 4/2015 Ashida et al.
(Continued)

FOREIGN PATENT DOCUMENTS

CN 204367903 A 6/2015
CN 112285413 A * 1/2021 ............. G01R 19/25
(Continued)

OTHER PUBLICATIONS

Extended European Search Report for European Application No. 22904426.8, dated Nov. 14, 2024.
(Continued)

*Primary Examiner* — Crystal L Hammond
*Assistant Examiner* — Samantha L Faubert
(74) *Attorney, Agent, or Firm* — Birch, Stewart, Kolasch & Birch, LLP

(57) ABSTRACT

A battery protection apparatus including a first current sensor connected to a positive terminal of a battery to measure a first current value; a second current sensor connected to a negative terminal of the battery to measure a second current value; a contactor including a first contactor positioned between the positive terminal of the battery and the first current sensor and a second contactor positioned between the negative terminal of the battery and the second current sensor; and a controller for setting a representative current value among the first current value and the second current value, and determining whether the representative current value is an abnormal current, and thus, it is possible
(Continued)

to measure battery current stably even when one current sensor fails by measuring and monitoring current using heterogeneous current sensors, and protecting the battery from abnormal current based on the representative current value of the battery.

32 Claims, 5 Drawing Sheets

(58) Field of Classification Search
CPC .... G01R 31/36; G01R 31/392; G01R 19/003; G01R 19/0038; H02H 7/18
See application file for complete search history.

(56) References Cited

U.S. PATENT DOCUMENTS

| | | | | |
|---|---|---|---|---|
| 11,353,484 | B2 * | 6/2022 | Choi | G01R 31/2829 |
| 2010/0004885 | A1 | 1/2010 | Nakanishi | |
| 2016/0291114 | A1 | 10/2016 | Bacquet et al. | |
| 2017/0243413 | A1 * | 8/2017 | Haggerty | G05B 23/0254 |
| 2021/0231713 | A1 | 7/2021 | Choi et al. | |
| 2022/0334189 | A1 | 10/2022 | Min | |

FOREIGN PATENT DOCUMENTS

| | | | | | |
|---|---|---|---|---|---|
| CN | 112684343 | A | | 4/2021 | |
| CN | 213544769 | U | * | 6/2021 | |
| CN | 213544789 | U | | 6/2021 | |
| JP | 2004-251625 | A | | 9/2004 | |
| JP | 2008-288192 | A | | 11/2008 | |
| JP | 2009-229404 | A | | 10/2009 | |
| JP | 2013-19832 | A | | 1/2013 | |
| JP | 2013019832 | A | * | 1/2013 | |
| JP | 2016-207646 | A | | 12/2016 | |
| JP | 2020-16493 | A | | 1/2020 | |
| JP | 2020-61823 | A | | 4/2020 | |
| JP | 2020-124027 | A | | 8/2020 | |
| JP | 6753343 | B2 | | 9/2020 | |
| KR | 10-2021-0085664 | A | | 7/2021 | |
| KR | 20210085664 | A | * | 7/2021 | H01F 3/14 |

OTHER PUBLICATIONS

Japanese Office Action for Japanese Application No. 2023-564600, dated Nov. 11, 2024, with English translation.

International Search Report (PCT/ISA/210) issue in PCT/KR2022/015268, dated Feb. 6, 2023.

Chinese Office Action and Search Report for Chinese Application No. 202280030733.2, dated Mar. 5, 2026, with English translation.

* cited by examiner

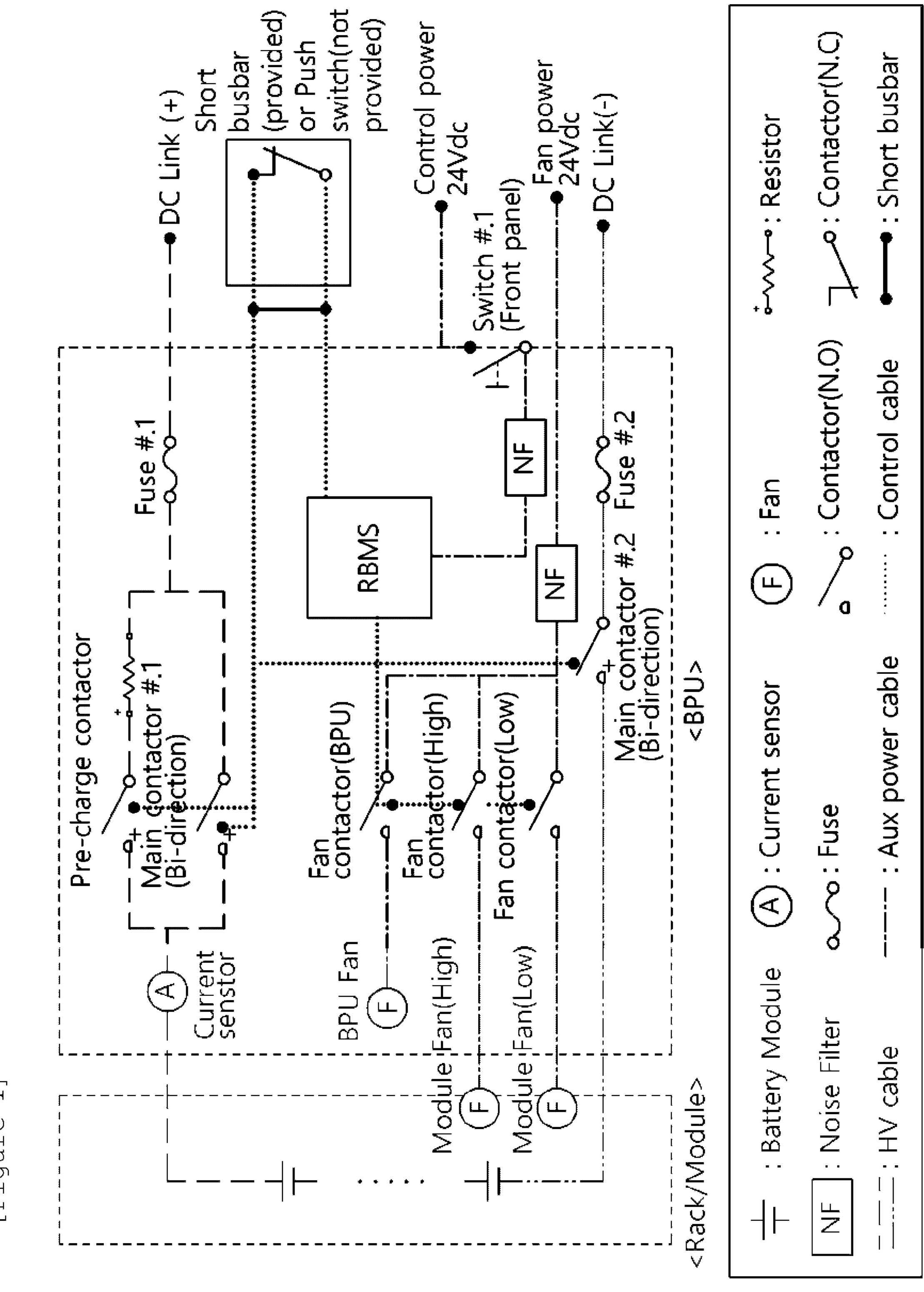
[Figure 1]
<Rack/Module>
Module Fan(High)
Module Fan(Low)
<BPU>
A
Current senstor
BPU Fan
Pre-charge contactor
Main contactor #1 (Bi-direction)
Fuse #1
DC Link (+)
Short busbar (provided) or Push switch(not provided)
RBMS
Fan contactor(BPU)
Fan contactor(High)
Fan contactor(Low)
Control power 24Vdc
Switch #1 (Front panel)
NF
NF
Fan power 24Vdc
DC Link(-)
Fuse #2
Main contactor #2 (Bi-direction)
: Battery Module
NF : Noise Filter
: HV cable
A : Current sensor
: Fuse
: Aux power cable
F : Fan
: Contactor(N.O)
: Control cable
: Resistor
: Contactor(N.C)
: Short busbar

[Figure 2]
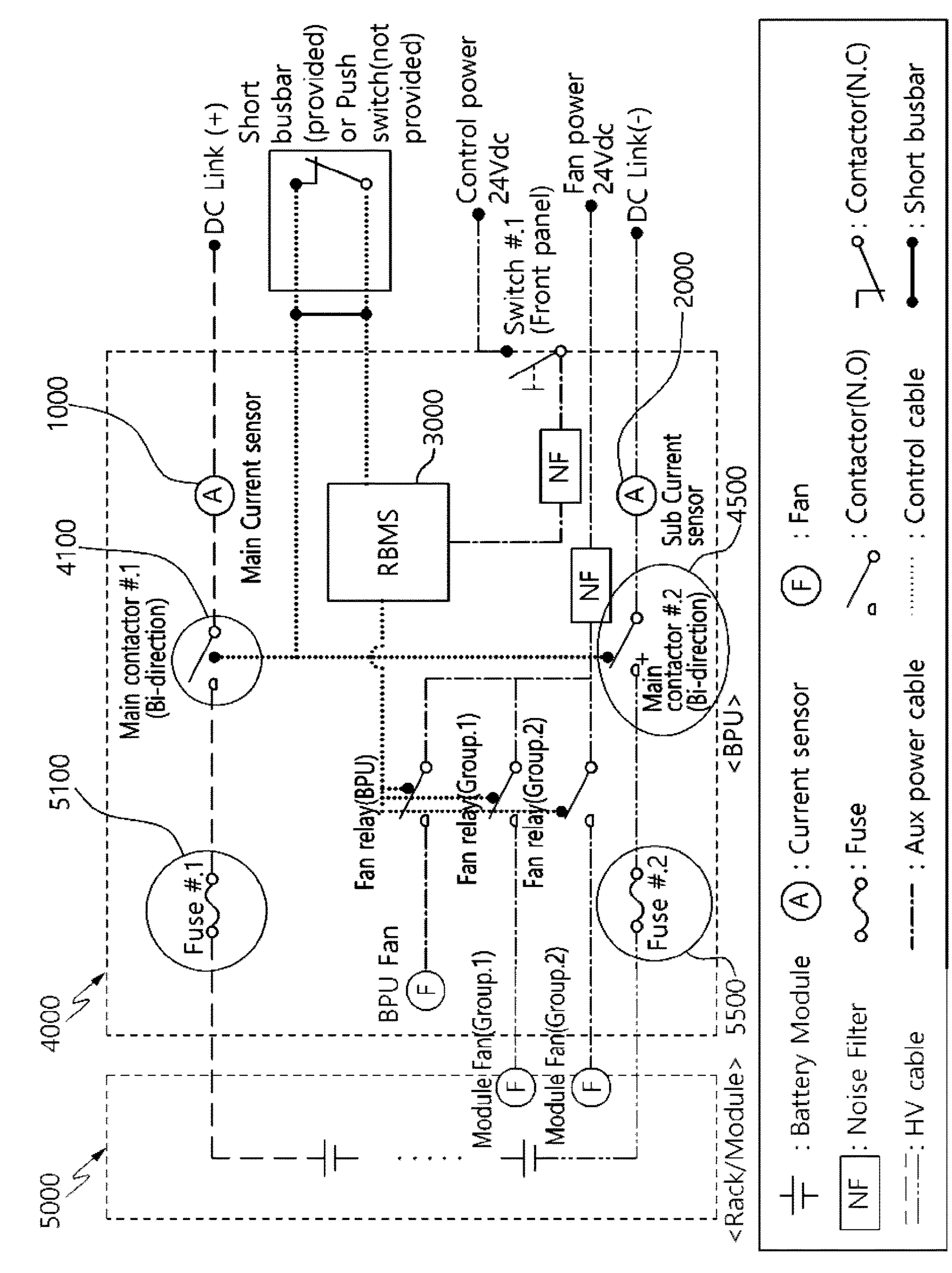

[Figure 3]
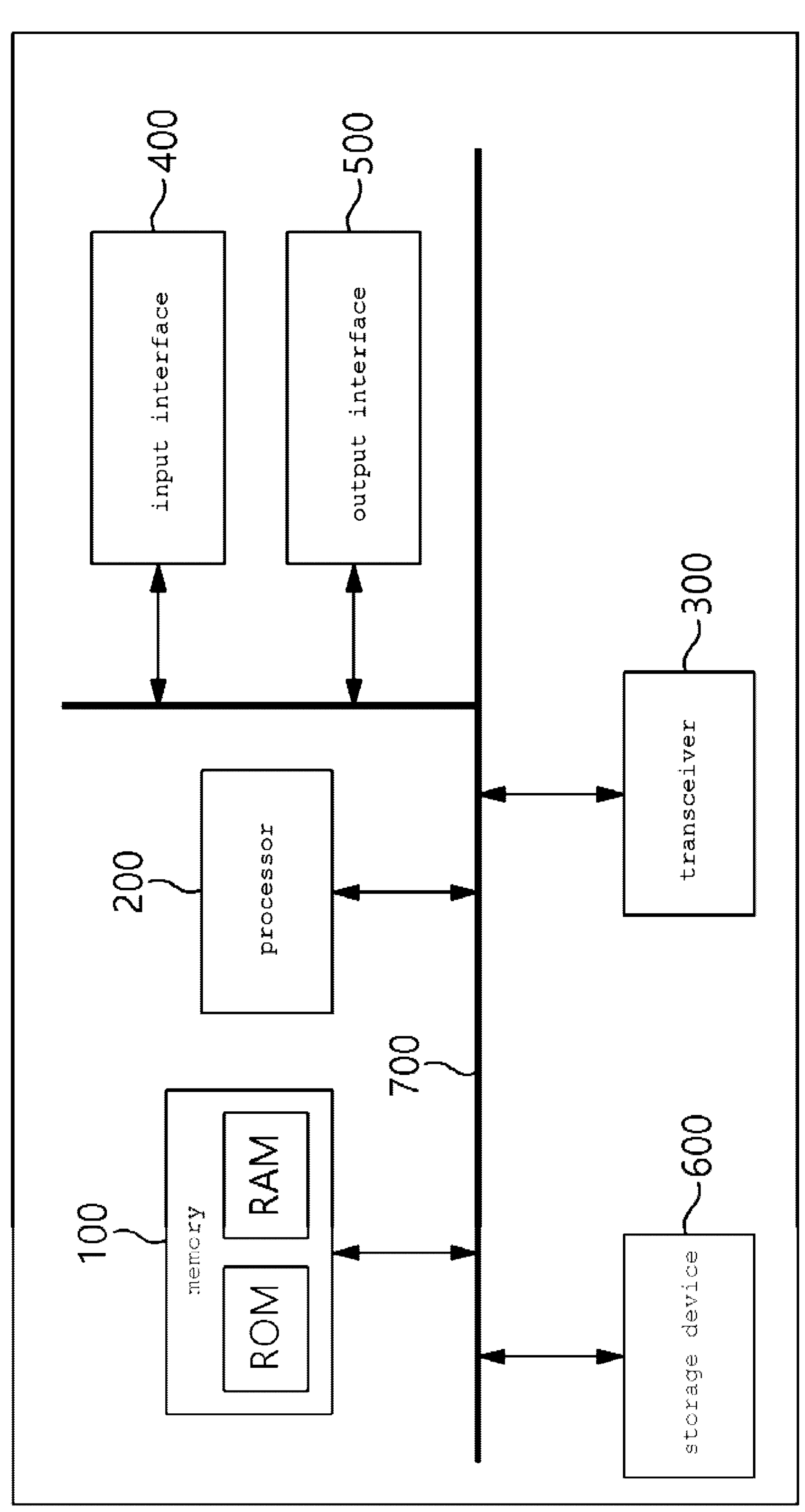

[Figure 4]

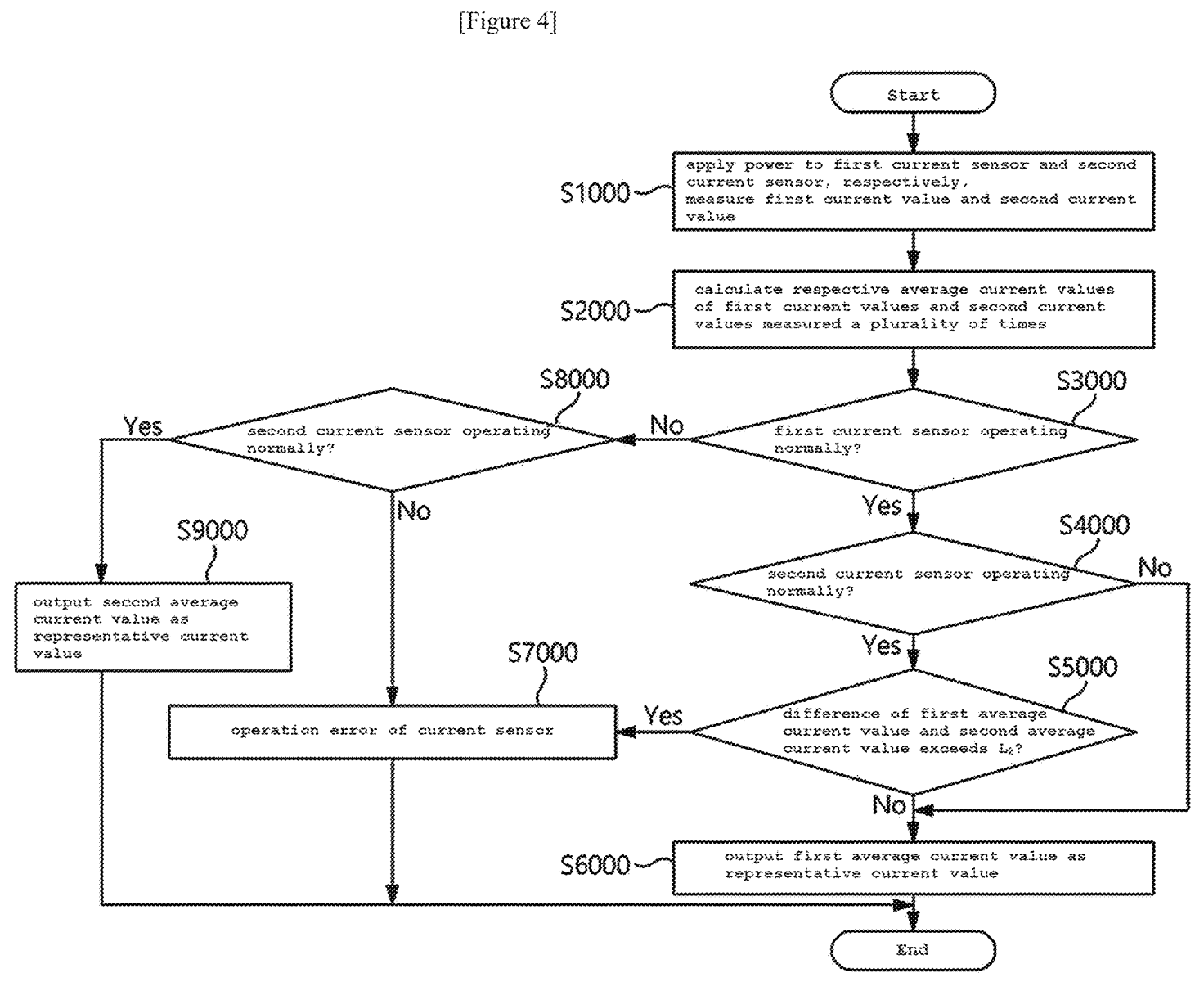

Start

S1000 apply power to first current sensor and second current sensor, respectively, measure first current value and second current value S2000 calculate respective average current values of first current values and second current values measured a plurality of times S3000 first current sensor operating normally?

Yes

No

S4000 second current sensor operating normally?

Yes

No

S5000 difference of first average current value and second average current value exceeds $L_2$?

Yes

No

S6000 output first average current value as representative current value

S7000 operation error of current sensor

S8000 second current sensor operating normally?

Yes

No

S9000 output second average current value as representative current value

End

[Figure 5]

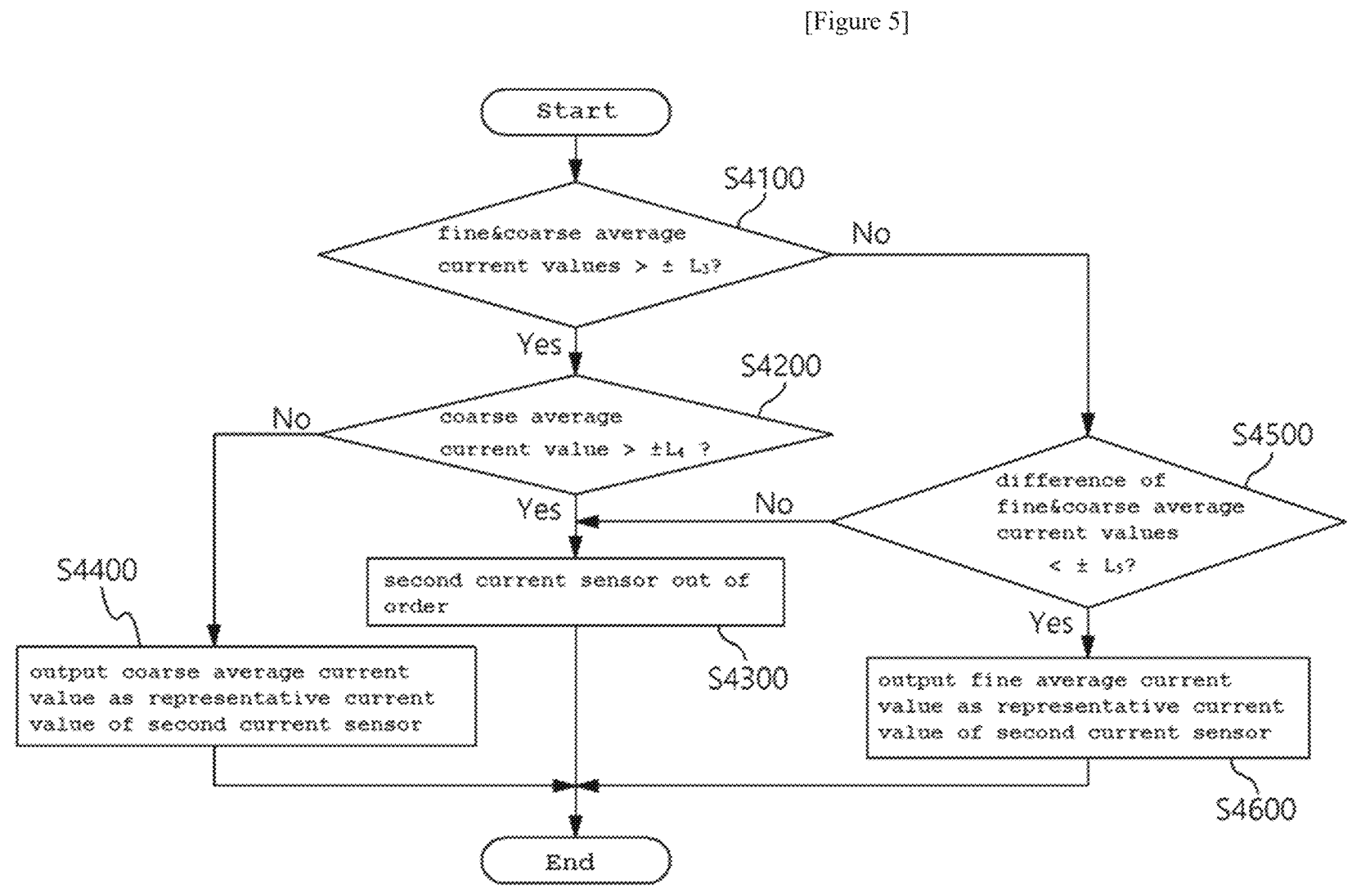

Start

S4100
fine&coarse average current values > ± $L_3$?

Yes

No

S4200
coarse average current value > $\pm L_4$ ?

Yes

No

S4300
second current sensor out of order

S4400
output coarse average current value as representative current value of second current sensor S4500
difference of fine&coarse average current values < ± $L_5$?

Yes

No

S4600
output fine average current value as representative current value of second current sensor End

BATTERY CONDITION MONITORING DEVICE AND METHOD, AND BATTERY PROTECTION DEVICE

CROSS REFERENCE TO RELATED APPLICATIONS

This application claims priority to and the benefit of Korean Patent Application No. 10-2021-0173099 filed in the Korean Intellectual Property Office on Dec. 6, 2021, the entire contents of which are incorporated herein by reference.

TECHNICAL FIELD

The present invention relates to an apparatus and a method for monitoring battery state, and an apparatus for protecting a battery, and more particularly, to an apparatus and a method for monitoring battery state, and an apparatus for protecting a battery by measuring and monitoring current using different types of current sensors, thereby protecting the battery from abnormal current even when any one current sensor fails.

BACKGROUND ART

Recently, as a demand for portable electronic products such as notebooks, video cameras, and mobile phones has rapidly increased and as a development of electric vehicles, energy storage devices, robots, and satellites has been in full swing, researches for high-performance batteries that can be repeatedly charged and discharged are actively progressing.

Among batteries, lithium secondary batteries are in the limelight because of their advantages of free charge and discharge, very low self-discharge rate, and high energy density because they hardly have a memory effect compared to nickel-based secondary batteries.

A battery protection device may generally have a current sensor for measuring current. The current sensor monitors a state of a battery by measuring current flowing in a charging/discharging path of the battery and detects overcurrent flowing in a battery pack. In addition, the current measured by the current sensor may be used as information for calculating State of Charge (SOC) or may be used as a basis for determining whether a charge/discharge process is normally performed.

However, since only one current sensor is applied to a conventional battery protection device, it is difficult to diagnose battery abnormalities using current when the current sensor fails.

DETAILED DESCRIPTION OF THE INVENTION

Technical Problem

In order to solve the problem, an object of the present invention is to provide a battery state monitoring apparatus with high-efficiency, high-stability and high-reliability.

In order to solve the problem, another object of the present invention is to provide a battery state monitoring method with high-efficiency, high-stability and high-reliability.

In order to solve the problem, the other object of the present invention is to provide a battery protection apparatus with high-efficiency, high-stability and high-reliability.

Technical Solution

In order to achieve the objective of the present disclosure, an apparatus for monitoring a state of a battery may comprise: a first current sensor connected to a positive terminal of a battery to measure a first current value; a second current sensor connected to a negative terminal of the battery to measure a second current value; and a controller configured to set a representative current value among the first current value and the second current value according to whether at least one of the first current sensor and the second current sensor is out of order and to monitor the representative current value.

Here, the first current sensor is of a different type from the second current sensor.

The controller may be configured to: apply power to the first current sensor and the second current sensor to measure a first average current value and a second average current value, respectively; determine whether the first current sensor is out of order based on the first average current value; and determine whether the second current sensor is out of order based on the second average current value.

The controller may further be configured to compare the first average current value with a specific threshold value to determine whether the first current sensor is out of order.

The controller may further be configured to determine that the first current sensor is out of order when a CAN signal transmitted periodically from the first current sensor is not received.

The controller may further be configured to determine that the first current sensor is out of order when an error message is received among CAN signals periodically transmitted from the first current sensor.

The first current sensor may include a flux type current sensor.

The second current sensor may include a hall type two-channel current sensor including a first channel and a second channel.

The controller may further be configured to: calculate an average current value in the first channel and an average current value in the second channel, separately; compare the average current value in the first channel and the average current value in the second channel with a current specification of the first channel.

The controller may further be configured to: upon the average current value in the first channel and the average current value in the second channel being greater than or equal to the current specification of the first channel, compare the average current value in the second channel with a current specification of the second channel.

The controller may further be configured to: determine that the second current sensor is out of order in the instance that the average current value in the second channel is greater than the current specification in the second channel; and set the average current value in the second channel as the representative current value of the second current sensor in the instance that the average current value in the second channel is less than or equal to the current specification of the second channel.

The controller may further be configured to: in the instance that at least one of the average current value in the first channel and the average current value in the second channel is smaller than the current specification of the first channel and a difference of the average current value in the first channel and the average current value in the second channel is equal to or less than a specific threshold value, set the average current value in the first channel as the representative current value of the second current sensor.

The controller may further be configured to: in the instance that at least one of the average current value in the first channel and the average current value in the second channel is smaller than the current specification in the first channel, and a difference between the average current value in the first channel and the average current value in the second channel exceeds a specific threshold value, determine that the second current sensor is out of order.

The controller may further be configured to: in the instance that the first current sensor and the second current sensor are determined to be normal, calculate a difference between the first average current value and the second average current value; output a first average current value as a representative current value in the instance that the difference is less than a specific threshold value; determine that a current measurement error of the battery has occurred in the instance that the difference exceeds the specific threshold value.

The controller may further be configured to output the first average current value as a the representative current value when it is determined that the first current sensor is normal and the second current sensor is out of order.

The controller may further be configured to output the second average current value as the representative current value when it is determined that the first current sensor is out of order and the second current sensor is normal.

The controller is configured to determine that a current measurement error of the battery has occurred when it is determined that the first current sensor and the second current sensor are out of order.

The apparatus can be configured to be applied to a battery protection apparatus that protects the battery by controlling a contactor in the instance that the representative current value is greater than or equal to a specific threshold value.

According to another embodiment of the present disclosure, a battery protection apparatus may comprise: a first current sensor connected to a positive terminal of a battery to measure a first current value; a second current sensor connected to a negative terminal of the battery to measure a second current value; a contactor including a first contactor positioned between the positive terminal of the battery and the first current sensor and a second contactor positioned between the negative terminal of the battery and the second current sensor; and a controller configured to set a representative current value among the first current value and the second current value, determine whether the representative current value is an abnormal current, and compare the representative current value with a specific threshold value to determine whether the representative current value is an abnormal current and controls the contactor to protect the battery according to whether or not the representative current value is an abnormal current.

According to another embodiment of the present disclosure, a method for monitoring battery state by setting a representative current value among a first current value and a second current value depending on whether at least one of a first current sensor for measuring the first current value and a second current sensor for measuring the second current value is out of order, the first current sensor is-being connected to a positive terminal of a battery and the second current sensor connected to a negative terminal of the battery, the method may comprise: calculating a first average current value and a second average current value, by applying power to the first current sensor and the second current sensor, respectively, determining whether the first current sensor is out of order based on the first average current value, determining whether the second current sensor is out of order based on the second average current value and setting a current value of any one of the first current sensor and the second current sensor that normally operates as the representative current value to monitor the battery.

The determining whether the first current sensor is out of order based on the first average current value may include comparing the first average current value with a specific threshold value to determine whether the first current sensor is out of order.

The first current sensor may include a flux type current sensor.

The second current sensor may include a hall type two-channel current sensor including a first channel and a second channel.

The calculating a first average current value and a second average current value, by applying power to the first current sensor and the second current sensor, respectively, may include calculating the first average current value of first current values measured a plurality of times by the first current sensor, and separately calculating an average current value in the first channel and an average current value in the second channel in the second current sensor.

The determining whether the second current sensor is out of order based on the second average current value may include comparing the average current value in the first channel and the average current value in the second channel with a current specification of the first channel.

The comparing the average current value in the first channel and the average current value in the second channel with the current specification of the first channel may include: upon the average current value in the first channel and the average current value in the second channel being greater than or equal to the current specification of the first channel, comparing the average current value in the second channel with a current specification of the second channel.

The determining whether the second current sensor is out of order based on the second average current value includes: comparing the average current value in the second channel with a current specification of the second channel including: determining that the second current sensor is out of order in the instance that the average current value in the second channel is greater than the current specification in the second channel; and setting the average current value in the second channel as the representative current value of the second current sensor in the instance that the average current value in the second channel is less than or equal to the current specification of the second channel.

The comparing the average current value in the first channel and the average current value in the second channel a with the current specification of the first channel may include: in the instance that at least one of the average current value in the first channel and the average current value in the second channel is smaller than the current specification of the first channel and a difference between the average current value in the first channel and the average current value in the second channel is less than or equal to a specific threshold value, setting the average current value in the first channel as the representative current value of the second current sensor.

The comparing the average current value in the first channel and the average current value in the second channel with a current specification of the first channel may include: in the instance that at least one of the average current value in the first channel and the average current value in the second channel is smaller than the current specification of the first channel and a difference between the average current value in the first channel and the average current value in the second channel exceeds a specific threshold value, determining that the second current sensor is out of order.

The setting a current value of any one of the first current sensor and the second current sensor that normally operates as the representative current value to monitor the battery may include: calculating a difference between the first average current value and the second average current value in the instance that the first current sensor and the second current sensor are determined to be normal; outputting a first average current value as the representative current value in the instance that the difference is equal to or less than a specific threshold value; and determining that a current measurement error of the battery has occurred in the instance that the difference exceeds the specific threshold value.

The setting a current value of any one of the first current sensor and the second current sensor that normally operates as the representative current value to monitor the battery may include outputting the first average current value as the representative current value when it is determined that the first current sensor is normal and the second current sensor is out of order.

The setting a current value of any one of the first current sensor and the second current sensor that normally operates as a the representative current value to monitor the battery may include outputting the second average current value as the representative current value when it is determined that the first current sensor is out of order and the second current sensor is normal.

The method for monitoring battery may further comprise determining and outputting that a current measurement error of the battery has occurred when it is determined that the first current sensor and the second current sensor are out of order.

Advantageous Effects

According to embodiments of the present disclosure, the battery state monitoring apparatus and method, and the battery protection apparatus may comprise a first current sensor connected to a positive terminal of a battery to measure a first current value; a second current sensor connected to a negative terminal of the battery to measure a second current value; a contactor including a first contactor positioned between the positive terminal of the battery and the first current sensor and a second contactor positioned between the negative terminal of the battery and the second current sensor; and a controller configured to set a representative current value among the first current value and the second current value, and determine whether the representative current value is an abnormal current, and thus, it is possible to measure battery current stably even when one current sensor fails by measuring and monitoring current using heterogeneous current sensors, and protect the battery from abnormal current based on the representative current value of the battery, thereby providing high-efficiency, high-stability and high-reliability battery state monitoring apparatus and method, and a battery protection apparatus.

BRIEF DESCRIPTION OF THE DRAWINGS

FIG. 1 is a block diagram of a conventional battery protection unit.

FIG. 2 is a configuration diagram of a battery protection apparatus according to embodiments of the present invention.

FIG. 3 is a block diagram of a controller in a battery protection apparatus according to embodiments of the present invention.

FIG. 4 is a operational flowchart of a battery state monitoring method in a battery protection apparatus according to embodiments of the present invention.

FIG. 5 is a operational flowchart illustrating a step of determining whether a second current sensor is out of order in a battery protection method according to embodiments of the present invention.

1000: first current sensor
2000: second current sensor
3000: controller
4000: contactor
4100: first contactor 4500: second contactor
5000: fuse
5100: first fuse
5500: second fuse
100: memory
200: processor
300: tranceiver
400: input interface
500: output interface
600: storage device
700: bus
BPU: battery protection unit/apparatus

BEST MODE

The present invention may be modified in various forms and have various embodiments, and specific embodiments thereof are shown by way of example in the drawings and will be described in detail below. It should be understood, however, that there is no intent to limit the present invention to the specific embodiments, but on the contrary, the present invention is to cover all modifications, equivalents, and alternatives falling within the spirit and technical scope of the present invention. Like reference numerals refer to like elements throughout the description of the figures.

It will be understood that, although the terms such as first, second, A, B, and the like may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes combinations of a plurality of associated listed items or any of the plurality of associated listed items.

It will be understood that when an element is referred to as being "coupled" or "connected" to another element, it can be directly coupled or connected to the other element or an intervening element may be present. In contrast, when an element is referred to as being "directly coupled" or "directly connected" to another element, there is no intervening element present.

Terms used in the present application are used only to describe specific embodiments, and are not intended to limit the present invention. A singular form includes a plural form if there is no clearly opposite meaning in the context. In the present application, it should be understood that the term "include" or "have" indicates that a feature, a number, a step, an operation, a component, a part or the combination thereof described in the specification is present, but does not exclude a possibility of presence or addition of one or more other features, numbers, steps, operations, components, parts or combinations thereof, in advance.

Unless otherwise defined, all terms used herein, including technical and scientific terms, have the same meanings as commonly understood by one skilled in the art to which the present invention belongs. It will be further understood that terms, such as those defined in commonly used dictionaries, should be interpreted as having meanings that are consistent with their meanings in the context of the relevant art and will not be interpreted in an idealized or overly formal sense unless expressly so defined herein.

Hereinafter, exemplary embodiments of the present invention will be described in detail with reference to the accompanying drawings.

FIG. 1 is a block diagram of a conventional battery protection unit.

Referring to FIG. 1, a conventional battery protection unit (BPU) is connected to at least one battery and electrically protects the battery from abnormal currents.

More specifically, a conventional battery protection device (unit) is provided with one current sensor.

For example, the current sensor is provided in a non-contact type and wrapped around a bus bar connecting the battery and the contactor, so that one end of the current sensor may be located at a positive end of the battery. However, it is not limited to the description, and may be provided in any form capable of electrically protecting the battery from abnormal current.

In general, a current sensor protects a battery by detecting an overcurrent occurrence.

However, the conventional battery protection device provides only one current sensor, and thus, it is difficult to detect an abnormal current or a fault current when the current sensor fails, thereby not preventing damage to the battery.

Therefore, the present invention provides a battery protection apparatus and a method for preventing damage to a battery due to a failure of a current sensor by using different types of current sensors, which will be described hereinafter.

FIG. 2 is a configuration diagram of a battery protection apparatus according to embodiments of the present invention.

Referring to FIG. 2, a battery protection apparatus (BPU) according to embodiments of the present invention, as described above, is connected to at least one battery and electrically protects the battery from abnormal current such as overcurrent. Here, the battery may be a battery module or a battery rack. The battery module has a configuration in which a plurality of battery cells (cells), which are the minimum units of the battery, are combined in series and parallel, and the battery rack may include a plurality of battery modules.

Describing the battery protection apparatus according to embodiments of the present invention in more detail for each component, the battery protection apparatus (BPU) may include a battery state monitoring unit, a contactor (Main Contactor; MC, 4000), and a fuse 5000, the battery state monitoring apparatus including a first current sensor 1000, a second current sensor 2000, a controller 3000. Here, the battery state monitoring unit may also be provided as a separate device including the first current sensor 1000, the second current sensor 2000, and the controller 3000. In addition, the fuse 5000 in the battery protection apparatus (BPU) may not necessarily be used.

Describing components of the battery state monitoring apparatus provided as the battery state monitoring unit in the battery protection apparatus (BPU) in more detail, the first current sensor 1000 and the second current sensor 2000 may be devices for detecting abnormal currents such as overcurrent generated in the battery.

The first current sensor 1000 may be connected to a positive terminal of the battery. In more detail, one end of the first current sensor 1000 may be connected to the other end side of the first contactor 3100 to be described later, and the other end of the first current sensor 1000 may be connected to a positive terminal of a DC link.

According to an embodiment, the first current sensor 1000 may be a flux type current sensor.

More specifically, the first current sensor 1000 may transmit a measurement value to the controller 3000 to be described later using CAN communication. For example, the measured value of the first current sensor 1000 may be provided as a current value or a voltage value.

Here, the detection accuracy of the first current sensor 1000 may be higher than that of the second current sensor 2000 to be described later.

Meanwhile, the second current sensor 2000 may be located at a negative terminal side of the battery. More specifically, one end of the second current sensor 2000 may be located on a side of the other end of a second contactor 3500 to be described later, and the other end of the second current sensor 2000 may be located on a negative terminal side of a DC link.

According to embodiments, the second current sensor 2000 may be a different type from the first current sensor 1000. In other words, the battery state monitoring apparatus may include different types of current sensors. For example, the second current sensor 2000 may be a hall type current sensor.

The second current sensor 2000 may transmit measurement values to the controller 3000 to be described later. For example, a measurement value of the second current sensor 2000 may be provided as a voltage measurement.

The controller 3000 may supply power to the first current sensor 1000 and the second current sensor 2000.

Furthermore, the controller 3000 may determine whether at least one of the first current sensor 1000 and the second current sensor 2000 is out of order. Accordingly, the controller 3000 may measure a magnitude of current, even when current measurement is impossible due to an error that has occurred in one sensor, using the other sensor operating normally.

In other words, the controller 3000 may obtain the first current value measured by the first current sensor 1000 and the second current value measured by the second current sensor 2000. Here, when the measurement value of the first current sensor 1000 or the second current sensor 2000 is provided as a voltage value, the controller 3000 may convert the obtained measurement value into a current value, analyze it, and determine whether the first current sensor 1000 and the second current sensor 2000 are out of order. Accordingly, the controller 3000 may monitor generation of abnormal current in the battery based on a current value measured by a normally operating sensor among the first current sensor 1000 and the second current sensor 2000. The operation of the controller 3000 for monitoring a state of the battery will be described in more detail using a method for monitoring a state of the battery.

Meanwhile, the controller 3000 may control an opening and closing operation of the contactor 4000, to be described later, according to a representative current value measured by the first and second current sensors 1000 and 2000. For example, the contactor 4000 may be a bi-directional contactor.

According to an embodiment, the controller 3000 may keep the first contactor 4100 or the second contactor 4500 closed in the instance that the representative current value measured from the first current sensor 1000 and the second current sensor 2000 is less than a certain reference, Accordingly, the battery may be charged or discharged by being connected to a charge/discharge circuit by the first contactor 4100 or the second contactor 4500.

In addition, the controller 3000 may switch the first contactor 4100 and the second contactor 4500 to an open state, which will be described later, when the measured value of the first current sensor 1000 or the second current sensor is equal to or greater than a predetermined reference. Accordingly, the battery may be cut off from the charge/discharge circuit by the first contactor 4100 and the second contactor 4500.

According to an embodiment, the controller 3000 may be a RBMS (Rack BMS) or may be included in the RBMS as a part of the RBMS. The operation of the controller 3000 will be described in more detail with reference to FIG. 3 below.

FIG. 3 is a block diagram of a controller in a battery protection apparatus according to embodiments of the present invention.

Referring to FIG. 3, the controller 3000 in the battery protection apparatus may include a memory 100, a processor 200, a transceiver 300, an input interface 400, an output interface 500, and a storage device 600.

According to embodiments, each of the components 100, 200, 300, 400, 500, and 600 included in the controller 3000 may be connected by a bus 700 to communicate with each other.

Among the components 100, 200, 300, 400, 500, and 600, the memory 100 and the storage device 600 may include at least one of a volatile storage medium and a non-volatile storage medium. For example, the memory 100 and the storage device 600 may include at least one of a read only memory (ROM) and a random access memory (RAM).

Among them, the memory 100 may include at least one instruction executed by the processor 200.

According to embodiments, the at least one instruction may include an instruction to calculate a first average current value and a second average current value, respectively, by applying power to the first current sensor and the second current sensor; instruction to determine whether the first current sensor is out of order based on the first average current value; instruction to determine whether the second current sensor is out of order based on the second average current value; and instruction to set a current value of any one of the first current sensor and the second current sensor that normally operates as a representative current value to monitor the battery.

The processor 200 may mean a central processing unit (CPU), a graphics processing unit (GPU), or a dedicated processor on which methods according to embodiments of the present invention are performed.

As described above, the processor 200 may execute at least one program command stored in the memory 100.

Referring back to FIG. 2, the contactor 4000 of the battery protection apparatus (BPU) is an electrical switchgear and can be operated as open/closed by the controller 3000 to be described later. In other words, the contactor 4000 may charge or discharge the battery or block charging and discharging of the battery according to a command from the controller 3000 to be described later. For example, the contactor 4000 may be a magnetic contactor.

More specifically, the contactor 4000 may include a first contactor 4100 and a second contactor 4500.

One end of the first contactor 4100 may be connected in series with the other end of the first fuse 5100 to be described later, and the other end of the first contactor 4100 may be connected in series with a positive terminal of the DC link where the first current sensor 1000 is located. In other words, the first contactor 4100 may be located between a positive terminal of the battery and the first current sensor 1000.

In addition, one end of the second contactor 4500 may be connected in series with the other end of the second fuse 5500 to be described later, and the other end of the second contactor 4500 may be connected in series with a negative terminal of the DC link where the second current sensor 2000 is located. In other words, the second contactor 4500 may be positioned between a negative terminal of the battery and the second current sensor 2000.

The first contactor 4100 and the second contactor 4500 may be provided as bi-directional contactors. Accordingly, the first contactor 4100 and the second contactor 4500 may be opened and closed by the controller 3000 according to measured values of the first current sensor 1000 or the second current sensor 2000.

According to an embodiment, the first contactor 4100 and the second contactor 4500 may be configured to be controlled in a closed state when the measured values of the first current sensor 1000 and the second current sensor 2000 are less than a predetermined reference by the controller 3000.

According to another embodiment, the first contactor 4100 and the second contactor 4500 may be configured to be controlled in an open state by the controller 3000 when the measured value of the first current sensor 1000 or the second current sensor 2000 exceeds a predetermined reference.

The fuse 5000 is one of the main components of the BPU to protect the battery when a short-circuit current occurs, and may be a protection device that is passively disconnected to protect the battery when a short-circuit current occurs. For example, the fuse 5000 is a disposable component that requires periodic replacement during use.

More specifically, the fuse 5000 may include a first fuse 5100 and a second fuse 5500.

The first fuse 5100 may have one end connected to a positive terminal of the battery and the other end connected to the first contactor 4100.

The second fuse 5500 may have one end connected to a negative terminal of the battery and the other end connected to the second contactor 4500.

However, the battery protection apparatus according to an embodiment of the present invention may not necessarily use a fuse 5000.

The battery protection apparatus according to the embodiments of the present invention has been described above. Hereinafter, a battery state monitoring method and a battery protection method performed by a controller in a battery protection device will be described.

FIG. 4 is a operational flowchart of a battery state monitoring method in a battery protection apparatus according to embodiments of the present invention.

Referring to FIG. 4, the processor 200 of the controller 3000 in the battery protection apparatus may apply power to the first current sensor 1000 and the second current sensor 2000, respectively, and measure current values individually to monitor a state of the battery (S1000).

According to an embodiment, the processor 200 may measure current values a plurality of times per second using the first current sensor 1000. Here, the first current sensor 1000 may be a flux type.

According to another embodiment, the processor 200 may measure the current values a plurality of times per second using the second current sensor 2000. Here, the second current sensor 2000 may be a Hall type sensor including two channels of a fine channel and a coarse channel.

Thereafter, the processor 200 may calculate an average current value of the current values of the first current sensor 1000 measured from the first current sensor 1000 and an average current value of the current values of the second current sensor 2000 measured from the second current sensor 2000, respectively (S2000).

According to an embodiment, the processor 200 may use the first current sensor 1000 to calculate an average value of a plurality of current values calculated plurality of times per second.

According to another embodiment, the processor 200 may use the second current sensor 2000 to respectively calculate average current values of current values for the fine channel and for the coarse channel measured multiple times per second.

Then, the processor 200 may determine whether the first current sensor 1000 is out of order based on the calculated average current value. In other words, it may be determined whether the first current sensor operates normally (S3000).

According to an embodiment, the processor 200 may determine whether the first current sensor 1000 is out of order by comparing the average current value with a preset first threshold value (out of range).

More specifically, the processor 200 may determine that the first current sensor 1000 is out of order when the average current value exceeds the first threshold value. Here, the first threshold value is preset and may be included in a specification of the first current sensor 1000.

According to another embodiment, the processor 200 may perform a sensor loss of communication (LOC) diagnosis to determine whether the first current sensor 1000 is out of order.

Here, the sensor LOC diagnosis may relate to determining whether the controller 3000 receives a CAN signal periodically transmitted by the first current sensor 1000. For example, in case that the first current sensor 1000 itself sends a CAN signal to the controller 3000 every 10 ms, but the controller 3000 does not receive the CAN signal, it can be determined that the first current sensor 1000 is out of order.

According to another embodiment, an error message is received, by the controller 3000, among the CAN signals transmitted from the first current sensor 1000, the processor 2000 may determine that the first current sensor 1000 fails.

Then, the processor 200 may determine whether the second current sensor 2000 is out of order. Determining whether the second current sensor 2000 is out of order may be performed independently and concurrently with determining whether or not the first current sensor 1000 is out of order. The step of determining whether the second current sensor 2000 is out of order will be described in more detail with reference to FIG. 5 to be described later.

According to an embodiment, when it is determined that the second current sensor 2000 is normal (S4000), that is, when it is determined that both the first current sensor 1000 and the second current sensor 2000 are normal, the processor 200 may calculate a difference of an average current value of the first sensor 1000 and an average current value of the second sensor 2000.

Here, when the calculated difference of the average current value of the first sensor 1000 and the average current value of the second sensor 2000 is equal to or less than a second threshold value $L_2$ (S5000), the processor 200 may output the average current value of the first current sensor 1000 as a representative current value (S6000). Then, the processor 200 may transmit the representative current value to the BBMS. Here, the second threshold value may be a preset reference value.

Meanwhile, when the calculated difference of the average current value of the first sensor 1000 and the average current value of the second sensor 2000 exceeds the second threshold value (S5000), the processor 200 may transmit an operation error signal of the current sensor (S7000). In other words, if both the first current sensor and the second current sensor are normal and the difference of the average current value of the first current sensor and the average current value of the second current sensor is equal to or greater than a predetermined value, the processor 200 may determine that an operation error of the sensor has occurred.

According to another embodiment, when it is determined that the second current sensor 2000 is out of order, that is, when it is determined that the first current sensor 1000 is normal and the second current sensor 2000 is out of order (S5000), the processor 200 may move to step S6000 again and set the average current value of the first current sensor 1000 as the representative current value.

Meanwhile, the processor 200 may determine whether the second current sensor 2000 is out of order. In other words, the processor 200 may determine whether the second current sensor operates normally (S8000).

According to an embodiment, when it is determined that the second current sensor 2000 is operating normally (S8000), that is, when it is determined that the first current sensor 1000 is out of order and the second current sensor 2000 is normal, the processor 200 may select the second average current value of the second current sensor 2000 as the representative average value (S9000).

According to another embodiment, when it is determined that the second current sensor 2000 is out of order, that is, when it is determined that both the first current sensor 1000 and the second current sensor 2000 are out of order, the processor 200 may return to step S7000 and transmit an operation error signal of the current sensor.

FIG. 5 is a operational flowchart illustrating a step of determining whether a second current sensor is out of order in a battery protection method according to embodiments of the present invention.

Referring to FIG. 5, the processor 200 may compare the average current value in the fine channel and the average current value in the coarse channel calculated in step S1000 with a third threshold value $L_3$. Here, as described above, the processor 200 may measure the second current value by applying power to the second current sensor 2000 in step S1000, but is not limited thereto, and may measure it after step S4000.

According to an embodiment, when the average current value in the fine channel and the average current value in the coarse channel are greater than or equal to the third threshold value $L_3$ (S4100), the processor 200 may compare the average current value in the coarse channel with a fourth threshold value ($L_4$). Here, the third threshold value $L_3$ may be included in a current specification (A) in the fine channel, and the fourth threshold value La may be included in a current specification (A) in the coarse channel.

Here, when the average current value in the coarse channel is greater than the fourth threshold value $L_4$ (S4200), the processor 200 may determine that the second current sensor 2000 is out of order (S4300).

Meanwhile, when the average current value in the coarse channel is smaller than or equal to the fourth threshold value $L_4$ (S4200), the processor 200 may set the average current value in the coarse channel as the representative current value of the second sensor 2000 (S4400).

According to another embodiment, when at least one of the average current value in the fine channel and the average current value in the coarse channel is smaller than the third threshold value $L_3$ (S4100), the processor 200 may determine whether the difference of average current values in the fine channel and in the coarse channel is normal. Here, the cases that the average current value in the fine channel and the average current value in the coarse channel are smaller than the third threshold value ($L_3$) may include a case that the average current value in the coarse channel is less than the third threshold value ($L_3$) and the average current value in the fine channel is less than the third threshold value ($L_3$), or a case that the average current value in the coarse channel exceeds the third threshold value ($L_3$) and the average current value in the fine channel is less than the third threshold value ($L_3$), or a case where the average current value in the coarse channel is less than or equal to the third threshold value $L_3$ and the average current value in the fine channel exceeds the third threshold value $L_3$.

Whether the difference of average current values in the fine channel and the coarse channel is normal may be determined by comparing it with a fifth threshold value $L_5$. Here, the fifth threshold value $L_5$ may be a preset reference value.

The processor 200 may determine that it is normal if the difference of respective average current values in the fine channel and the coarse channel is less than a fifth threshold value $L_5$ (S4500), set and output the average current value in the fine channel as the representative current value of second sensor 2000 (S4600).

Meanwhile, if the difference of respective average current values in the fine channel and the coarse channel exceeds the fifth threshold value $L_5$, the processor 200 may move to step S4300 and determine that the second sensor 2000 is out of order.

Referring back to FIG. 4, the processor 200 in the battery protection apparatus (BPU) according to an embodiment of the present invention may compare the representative current value with a specific threshold value to determine whether an abnormal current is generated in the battery.

Furthermore, the processor 200 may protect the battery by controlling the contactor according to whether the abnormal current occurs.

The battery state monitoring apparatus and method, and the battery protection apparatus according to embodiments of the present invention have been described.

The battery state monitoring apparatus and method, and the battery protection apparatus according to embodiments of the present invention may comprise a first current sensor connected to a positive terminal of a battery to measure a first current value; a second current sensor connected to a negative terminal of the battery to measure a second current value; a contactor including a first contactor positioned between the positive terminal of the battery and the first current sensor and a second contactor positioned between the negative terminal of the battery and the second current sensor; and a controller configured to set a representative current value among the first current value and the second current value, and determine whether the representative current value is an abnormal current, and thus, it is possible to measure battery current stably even when one current sensor fails by measuring and monitoring current using heterogeneous current sensors, and protect the battery from abnormal current based on the representative current value of the battery, thereby providing high-efficiency, high-stability and high-reliability battery state monitoring apparatus and method, and a battery protection apparatus.

The operations of the method according to the embodiments of the present invention may be implemented as a computer-readable program or code on a computer-readable recording medium. The computer-readable recording medium includes all types of recording devices in which data readable by a computer system is stored. In addition, the computer-readable recording medium may be distributed in a network-connected computer system to store and execute computer-readable programs or codes in a distributed manner.

In addition, the computer-readable recording medium may include a hardware device, such as a ROM, a RAM, and a flash memory, specially configured to store and execute program instructions. The program instructions may include not only machine language codes such as those generated by a compiler, but also high-level language codes that can be executed by a computer by using an interpreter or the like.

Although some aspects of the invention have been described in the context of the apparatus, it may also represent a description according to a corresponding method, wherein a block or apparatus corresponds to a method step or feature of a method step. Similarly, aspects described in the context of a method may also represent a feature of a corresponding block or item or a corresponding apparatus. Some or all of the method steps may be performed by (or using) a hardware device, such as, for example, a microprocessor, a programmable computer, or an electronic circuit. In some embodiments, one or more of the most important method steps may be performed by such an apparatus.

In the forgoing, the present invention has been described with reference to the exemplary embodiment of the present invention, but those skilled in the art may appreciate that the present invention may be variously corrected and changed within the range without departing from the spirit and the area of the present invention described in the appending claims.

The invention claimed is:

1. A battery protection apparatus comprising:

a first current sensor connected to a positive terminal of the battery to measure a first current value;

a second current sensor connected to a negative terminal of the battery to measure a second current value;

a controller configured to:

set a representative current value to be one of the first current value and the second current value according to whether at least one of the first current sensor and the second current sensor is out of order, and monitor the representative current value; and a contactor including:

a first contactor positioned between the positive terminal of the battery and the first current sensor; and a second contactor positioned between the negative terminal of the battery and the second current sensor, wherein the first current sensor and the second current sensor are located outside of the battery.

2. The apparatus of claim 1, wherein the first current sensor is of a different type from the second current sensor.

3. The apparatus of claim 1, wherein the controller is configured to:

apply power to the first current sensor and the second current sensor to measure a first average current value and a second average current value, respectively, determine whether the first current sensor is out of order based on the first average current value, and determine whether the second current sensor is out of order based on the second average current value.

4. The apparatus of claim 3, wherein the controller is configured to compare the first average current value with a specific threshold value to determine whether the first current sensor is out of order.

5. The apparatus of claim 3, wherein the second current sensor includes a hall type two-channel current sensor including a first channel and a second channel.

6. The apparatus of claim 5, wherein the controller is configured to:

calculate an average current value in the first channel and an average current value in the second channel, separately, and determine whether the second current sensor is out of order by comparing the average current value in the first channel and the average current value in the second channel with a current specification of the first channel.

7. The apparatus of claim 6, wherein the controller is configured to:

upon the average current value in the first channel and the average current value in the second channel being greater than or equal to the current specification of the first channel, compare the average current value in the second channel with a current specification of the second channel.

8. The apparatus of claim 7, wherein the controller is configured to:

determine that the second current sensor is out of order in an instance that the average current value in the second channel is greater than the current specification in the second channel, and set the average current value in the second channel as the representative current value of the second current sensor in an instance that the average current value in the second channel is less than or equal to the current specification of the second channel.

9. The apparatus of claim 6, wherein the controller is configured to:

in an instance that at least one of the average current value in the first channel and the average current value in the second channel is smaller than the current specification of the first channel and a difference of the average current value in the first channel and the average current value in the second channel is equal to or less than a specific threshold value, set the average current value in the first channel as the representative current value of the second current sensor.

10. The apparatus of claim 6, wherein the controller is configured to:

in an instance that at least one of the average current value in the first channel and the average current value in the second channel is smaller than the current specification in the first channel, and a difference between the average current value in the first channel and the average current value in the second channel exceeds a specific threshold value, determine that the second current sensor is out of order.

11. The apparatus of claim 3, wherein the controller is configured to:

in an instance that the first current sensor and the second current sensor are determined to be normal, calculate a difference between the first average current value and the second average current value, output the first average current value as the representative current value in an instance that the difference is less than a specific threshold value, and determine that a current measurement error of the battery has occurred in an instance that the difference exceeds the specific threshold value.

12. The apparatus of claim 3, wherein the controller is configured to output the first average current value as the representative current value when it is determined that the first current sensor is normal and the second current sensor is out of order.

13. The apparatus of claim 3, wherein the controller is configured to output the second average current value as the representative current value when it is determined that the first current sensor is out of order and the second current sensor is normal.

14. The apparatus of claim 3, wherein the controller is configured to determine that a current measurement error of the battery has occurred when it is determined that the first current sensor and the second current sensor are out of order.

15. The apparatus of claim 1, wherein the controller is configured to determine that the first current sensor is out of order when a controller area network (CAN) signal transmitted periodically from the first current sensor is not received.

16. The apparatus of claim 1, wherein the controller is configured to determine that the first current sensor is out of order when an error message is received among controller area network (CAN) signals periodically transmitted from the first current sensor.

17. The apparatus of claim 1, wherein the first current sensor includes a flux type current sensor.

18. The apparatus of claim 1, wherein the apparatus is configured to be applied to a battery protection apparatus that protects the battery by controlling the contractor in an instance that the representative current value is greater than or equal to a specific threshold value.

19. A method for monitoring battery state by setting a representative current value depending on whether at least one of a first current sensor and a second current sensor is out of order, the first current sensor being connected to a positive terminal of a battery and the second current sensor being connected to a negative terminal of the battery, the method comprising:

calculating a first average current value and a second average current value, by applying power to the first current sensor and the second current sensor, respectively;

determining whether the first current sensor is out of order based on the first average current value;

determining whether the second current sensor is out of order based on the second average current value;

setting a current value of any one of the first current sensor and the second current sensor that normally operates to be the representative current value to monitor the battery; and controlling a contactor including a first contactor positioned between the positive terminal of the battery and the first current sensor, and a second contactor positioned between the negative terminal of the battery and the second current sensor, based on the set current value, wherein the first current sensor and the second current sensor are located outside of the battery.

20. The method of claim 19, wherein the determining of whether the first current sensor is out of order based on the first average current value includes comparing the first average current value with a specific threshold value to determine whether the first current sensor is out of order.

21. The method of claim 19, wherein the first current sensor includes a flux type current sensor.

22. The method of claim 19, wherein the second current sensor includes a hall type two-channel current sensor including a first channel and a second channel.

23. The method of claim 22, wherein the determining of whether the second current sensor is out of order based on the second average current value includes:

comparing an average current value in the first channel and an average current value in the second channel with a current specification of the first channel.

24. The method of claim 23, wherein the comparing of the average current value in the first channel and the average current value in the second channel with the current specification of the first channel includes:

upon the average current value in the first channel and the average current value in the second channel being greater than or equal to the current specification of the first channel, comparing the average current value in the second channel with a current specification of the second channel.

25. The method of claim 23, wherein the comparing of the average current value in the first channel and the average current value in the second channel with the current specification of the first channel includes:

in an instance that at least one of the average current value in the first channel and the average current value in the second channel is smaller than the current specification of the first channel and a difference between the average current value in the first channel and the average current value in the second channel is less than or equal to a specific threshold value, setting the average current value in the first channel as the representative current value of the second current sensor.

26. The method of claim 23, wherein the comparing of the average current value in the first channel and the average current value in the second channel with the current specification of the first channel includes:

in an instance that at least one of the average current value in the first channel and the average current value in the second channel is smaller than the current specification of the first channel and a difference between the average current value in the first channel and the average current value in the second channel exceeds a specific threshold value, determining that the second current sensor is out of order.

27. The method of claim 22, wherein the determining of whether the second current sensor is out of order based on the second average current value includes:

comparing an average current value in the second channel with a current specification of the second channel, including:

determining that the second current sensor is out of order in an instance that the average current value in the second channel is greater than the current specification in the second channel; and setting the average current value in the second channel as the representative current value of the second current sensor in an instance that the average current value in the second channel is less than or equal to the current specification of the second channel.

28. The method of claim 19, wherein the calculating of the first average current value and the second average current value, by applying power to the first current sensor and the second current sensor, respectively, includes:

calculating the first average current value of current values measured a plurality of times by the first current sensor; and separately calculating an average current value in a first channel and an average current value in a second channel in the second current sensor.

29. The method of claim 19, wherein the setting of the current value of any one of the first current sensor and the second current sensor that normally operates as the representative current value to monitor the battery includes:

calculating a difference between the first average current value and the second average current value in an instance that the first current sensor and the second current sensor are determined to be normal;

outputting the first average current value as the representative current value in an instance that the difference is equal to or less than a specific threshold value; and determining that a current measurement error of the battery has occurred in an instance that the difference exceeds the specific threshold value.

30. The method of claim 19, wherein the setting the current value of any one of the first current sensor and the second current sensor that normally operates as the representative current value to monitor the battery includes outputting the first average current value as the representative current value when it is determined that the first current sensor is normal and the second current sensor is out of order.

31. The method of claim 19, wherein the setting the current value of any one of the first current sensor and the second current sensor that normally operates as the representative current value to monitor the battery includes outputting the second average current value as the representative current value when it is determined that the first current sensor is out of order and the second current sensor is normal.

32. The method of claim 19, further comprising determining and outputting that a current measurement error of the battery has occurred when it is determined that the first current sensor and the second current sensor are out of order.

* * * * *